(12) United States Patent
Chen et al.

(10) Patent No.: US 6,751,257 B1
(45) Date of Patent: Jun. 15, 2004

(54) VIDEO DECOMPRESSING SYSTEM WITH EFFICIENT MEMORY ACCESS CAPABILITY

(75) Inventors: Wen-Kuan Chen, Hsinchu Hsien (TW); Wei-Shiou Wu, Chiayi (TW); Ying-Chih Yang, Hsinchu (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 819 days.

(21) Appl. No.: 09/708,102

(22) Filed: Nov. 3, 2000

(51) Int. Cl.⁷ .................................................. H04N 7/12
(52) U.S. Cl. ............. 375/240.25; 375/240; 375/240.01; 375/240.12; 375/240.16
(58) Field of Search .................... 375/240.25, 240, 375/240.12, 240.16, 240.01

(56) References Cited

U.S. PATENT DOCUMENTS 6,301,299 B1 * 10/2001 Sita et al. .............. 375/240.01
6,356,587 B1 * 3/2002 Choi ........................... 375/240
6,370,192 B1 * 4/2002 Pearlstein et al. .......... 375/240
6,584,154 B1 * 6/2003 Wu ........................ 375/240.16

* cited by examiner

Primary Examiner—Chris Kelley
Assistant Examiner—Allen Wong
(74) Attorney, Agent, or Firm—Bacon & Thomas, PLLC

(57) ABSTRACT

A video decompressing system with high-efficiency memory access capability has a memory device for storing reference frames which are read out for performing motion compensation in decompressing process. The reference frame has its pixels arranged as a plurality of horizontal lines for being stored in the memory device. If the pixels of one horizontal line can not be integrally stored in one row of the memory device, the horizontal line is broken into at least two lines for being stored in the rows of the memory device. At the end portion of the row where the horizontal line is broken, a tail section is allocated for duplicating and storing pixels that are the same as those of a macroblock at a starting position of the next row, so as to avoid the page break problem.

11 Claims, 9 Drawing Sheets

VIDEO DECOMPRESSING SYSTEM WITH EFFICIENT MEMORY ACCESS CAPABILITY

BACKGROUND OF THE INVENTION

1. Field of the Invention

The present invention relates to a video decompressing system and, more particularly, to a video decompressing system with efficiency memory access capability.

2. Description of Related Art

With the progress of the digital electronic technique, the use of the digitized video data has greatly increased the convenience in enjoying a video article. However, the size of the digitized video data is always so tremendous, and thus, the data must be compressed to reduce its size for transmission or storage. For those skilled in the art, there are several well-known practical video compressing standards, for example, the JPEG, MPEG1, MPEG2, MPEG4 and H.26X.

It is known that a similarity is generally existed between the front and end portions of the video data, so that there is a redundancy in the video data. Therefore, some of the compressing standards utilize an algorithm to remove such a time redundancy, so as to compress the video data. For example, the MPEG system utilizes the motion compensation technique to achieve the purpose of compressing data. With reference to FIG. 6, there is shown a motion compensation process in the time domain for a MPEG system. As well known to those skilled in the art, the frame of a MPEG system is divided into multiple macroblocks (MB) for being compressed. As shown, there are three frames P0, P1 and P2 in FIG. 6. The macroblock MBC in frame P1 is a B-type macroblock, which is determined, during compressing process, by the motion vectors mvf and mvb of the macroblocks MBF and MBB, which are most similar to the macroblock MBC, in the frames P0 and P2, respectively. Therefore, in decompressing, these two motion vectors and corresponding difference data are sent to the MPEG decoder. As shown in FIG. 7, based on the motion vectors mvf and mvb, the corresponding macroblocks MBF and MBB can be read from the frames P0 and P2, respectively. Further with the use of the difference data, the original macroblock MBC can be reconstructed. If the macroblock MBC is a P-type macroblock, it can be dtetermined, during compressing process, by a motion vector mvf of the macroblock MBF, which is most similar to the macroblock MBC, in the frame P0. Therefore, in decompressing, the motion vector and difference data are sent to the MPEG decoder. As shown in FIG. 8, based on the motion vector mvf, the corresponding macroblock MBF can be read from the frame P0. Further with the use of the difference data, the original macroblock MBC can be reconstructed. As a result, the whole frame can be reconstructed and displayed realistically with least amound of data in transmission.

Moreover, in a video decompressing system, the frames that are involved in the decompressing process, are typically stored in DRAM. Therefore, in order to perform the motion compensation, the video decompressing system has to read the reference macroblock from DRAM, and then write data back to the DRAM when completing the motion compensation operation.

In DRAM operation, a page mode is usually selected for effectively utilizing the bandwidth in memory access. As to the DRAM architeture, each line of the DRAM is able to store $2^n$ bytes of data in a row. FIG. 9 shows a 1M×16 bit DRAM stored with several MPEG reference frames. Because the reference frame used in the MPEG system needs to be read out again generally by taking a data block of 17×17 bytes as a unit, the DRAM layout is usually arranged in such a manner that two memory blocks are continuously allocated with a pre-determined length, for example 360 words (each word has two bytes), from the starting address for storing I-type and P-type reference frames, for example frames 91 and 92. The decompressing frame, such as the B-type frame 93, is stored in the remaining memory area that is at right side of the reference frames. As such, the access to the memory generally does not cause a page break problem which may result in a poor utilization in memory bandwidth. Furthermore, the arrangement of the reference frames stored in the DRAM is similar to that of the original one. Therefore, the generation of addresses for read or write operation is simple and easy.

However, with the aforementioned DRAM layout for storing the reference frames, the line of the frame data needs to be folded up for storing when the width of the frame is greater than the pre-determined length of DRAM. Thus, the page break problem is encountered when reading the data of the reference frames, and further results in insufficient DRAM bandwidth and damaging the desompressing process. Therefore, there is a desired for the above video decompressing systems to be improved.

SUMMARY OF THE INVENTION

The object of the present invention is to provide a video decompressing system with high-efficiency memory access capability, such that the memory bandwidth is effectively utilized and the performance of decompression is significantly increased.

According to an embodiment of the present invention, the video decompressing system with efficienct memory access capability comprises a decompressing means, a memory device for storing reference frames which are read out for decompressing, and a memory controller for controlling memory access to the memory device, so as to read data from the memory device for being processed by the decompressing means, thereby reconstructing original frames to be stored in the memory device. The reference frame has its pixels arranged as a plurality of horizontal lines for being stored in the memory device. If the pixels of one horizontal line can not be integrally stored in one row of the mempry device, the horizontal line is broken into at least two lines for being stored in the rows of the memory device. At the end portion of the row where the horizontal line is broken, a tail section is allocated for duplicating and storing pixels that are the same as those of a macroblock at a starting position of the next row.

In another embodiment of the present invention, the reference frame has its pixels arranged as a plurality of macroblock lines for being stored in the memory device. If the pixels of one macroblock line can not be integrally stored in one macroblock row of the mempry device, the maroblock line is broken into at least two lines for being stored in the macroblock rows of the memory device. At the end portion of the macroblock row where the macroblock line is broken, a tail section is allocated for duplicating and storing pixels that are the same as those with a length of a macroblock at a starting position of the next macroblock row.

In a further embodiment of the present invention, the reference frame has its pixels arranged as a plurality of horizontal lines for being stored in the memory device in a linear address mode. At the end of each row of the memory device, a tail section is allocated for duplicating and storing pixels that are the same as those of a macroblock at the starting position of the next row.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
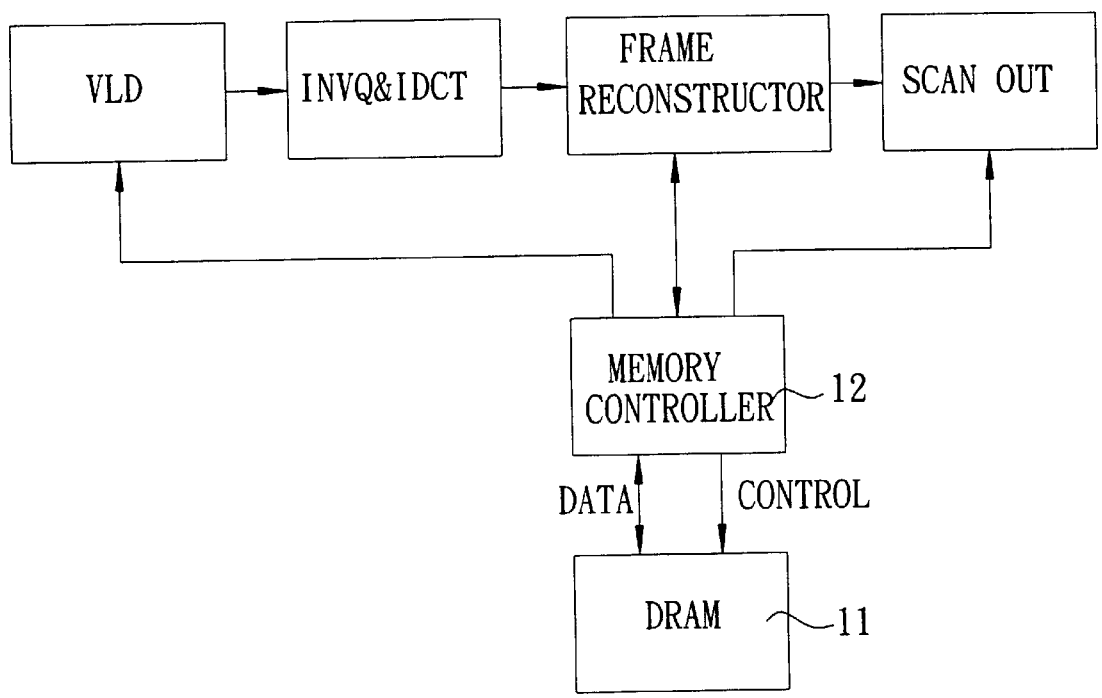
FIG. 1 is a functional block diagram of the video decompressing system with efficiency memory access capability in accordance with the present invention.

FIG. 1 shows a video decompressing system with efficiency memory access capability in accordance with the present invention. As shown, the system has a memory device 11, preferably composed of DRAM, for storing reference frames and other data. A memory controller 12 is provided to control the operation of the memory device 11, such that, when decompressing process, data is read out from the memory device 11 and processed by the variable-length decoder (VLD), inverse quantization and inverse discrete cosine transform (INVQ&IDCT), and frame reconstructor, so as to produce the original frames to be stored in the memory device 11 and scanned out for display.

Figure 2:
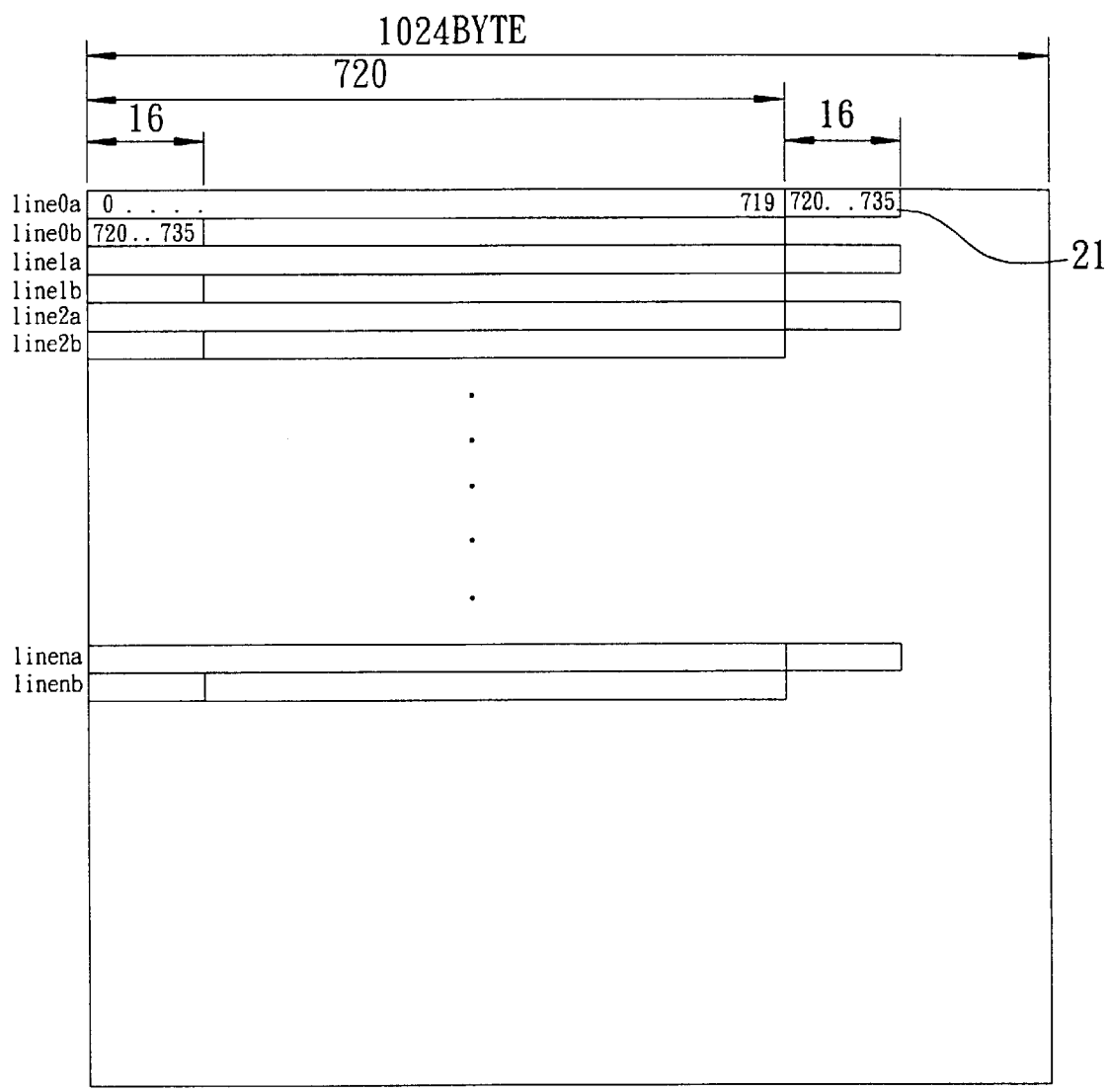
FIG. 2 shows a memory device for storing the reference frame in accordance with a first preferred embodiment of the present invention.

With reference to FIG. 2, there is shown the memory device 11 with a reference frame stored therein in accordance with a preferred embodiment of the present invention. As shown, the memory device 11 is a DRAM device and each row therein has 1024 bytes. The reference frame has its pixels arranged as a plurality of horizontal lines for being stored in the DRAM. If the width of the frame to be stored is 1440 pixels (each pixel is one byte), the pixels of a horizontal line can not be integrally stored in one row of the DRAM. Therefore, the horizontal line has to be broken into at least two lines for being stored in DRAM. In this preferred embodiment, each horizontal line is broken into two lines, each having 720 pixels. As such, the 0-th to 719-th pixels are stored in the first row of the DRAM. Furthermore, at the end portion of the first row where the horizontal line is broken, a tail section 21 is allocated for storing pixels of one macroblock (16 bytes). That is, the 720-th to 735-th pixels are subsequently stored in the first row. In the second row of the DRAM, the 720-th to 735-th pixels are stored again, and the other pixels, i.e., the 736-th to 1439-th pixels, of the horizontal line are subsequently stored. Accordingly, the pixels of a horizontal line of a frame can be stored in two rows of the DRAM. As shown in FIG. 2, the pixels of n-th horizontal line are broken into two lines, denoted by line na and line nb, for being stored in two rows of the DRAM, and at the end of the first row where the horizontal line is broken, pixels that are the same as those of a macroblock at the starting position of the next row are duplicated and stored therein.

Figure 3:
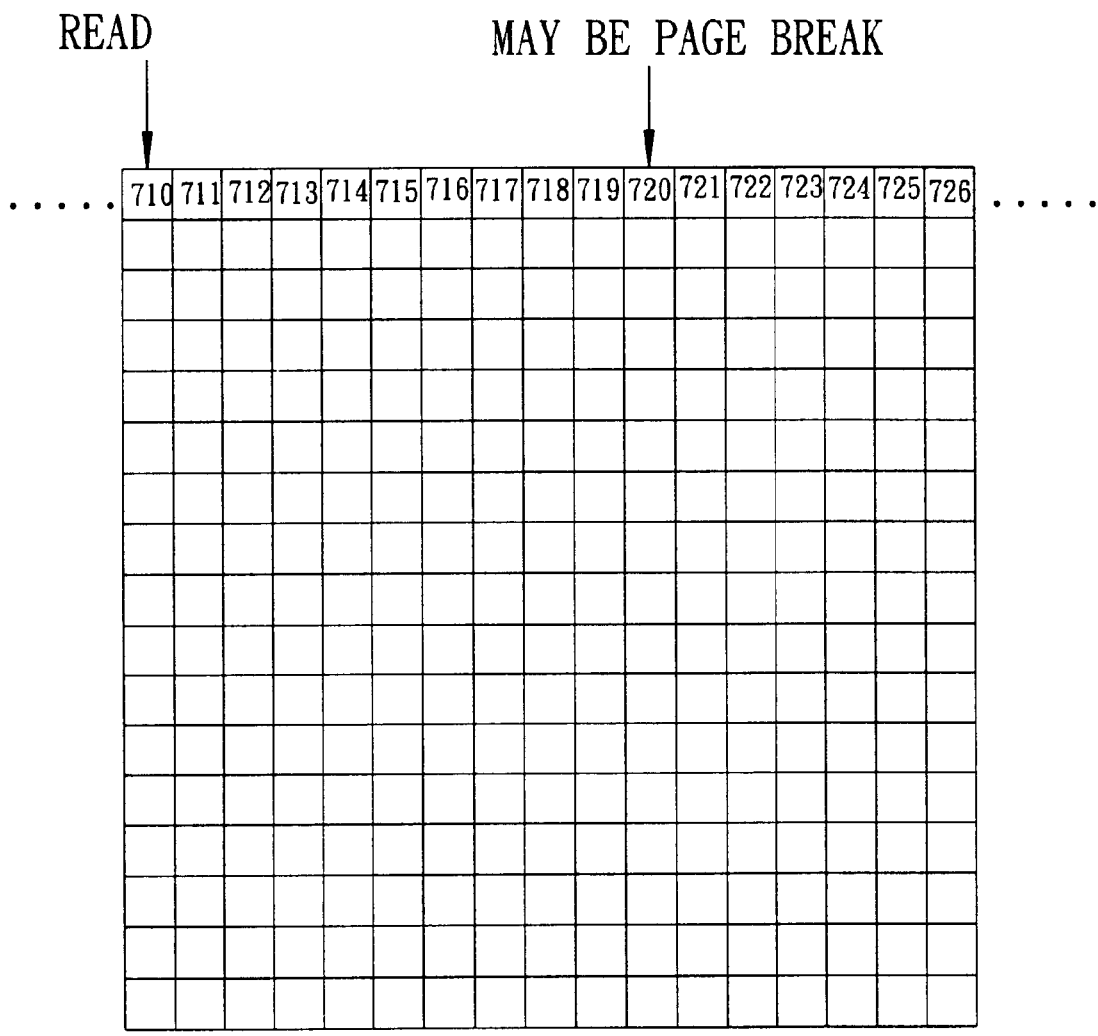
FIG. 3 schematically ullustrates a reference macroblock.

After the reference frames are stored in the memory device 11 by the arrangement as described hereinbefore, the page break problem can be avoided when the memory controller 12 reads data from the memory device 11 for decompressing. With reference to the exemplary macroblock of a reference frame in FIG. 3, the system is likely to read data of one macroblock from the 710-th pixel based on the result of the motion vector when performing motion compensation to decompress data. If the pixels of the frame are stored in the conventional manner, a page break will be encountered after the memory controller 12 reads the 719-th pixel, and thus the memory bandwidth is decreased. However, based on the arrangement of the pixels in the memory device 11 in accordance with the present invention, the 720-th to 735-th pixels are duplicated and subsequently stored after the 719-th pixel, so that there is no page break problem encountered in this macroblock read operation.

In view of the foregoing, it is known that the page break problem, which is caused by a row of DRAM being unable to completely store the pixels of a horizontal line, can be removed by duplicating and storing the pixels of a macroblock. Although these duplicated pixels may occupy a small amount of the DRAM bandwidth, the decompressing performance is not negatively influenced. Taking the aforementioned embodiment for example, the percentage of the duplicated pixels in the DRAM is only 16/1440=1.1%. Moreover, in the MPEG decompressing device, the bandwidth requirement is high only for decompressing the B-type frame, while the frame to be referenced in decompressing process is either an I-type frame or a P-type frame. Therefore, the aforementioned pixels of a macroblock are duplicated and stored only in I-type or P-type frame, so as not to negatively influence the decompressing performance.

Figure 4:
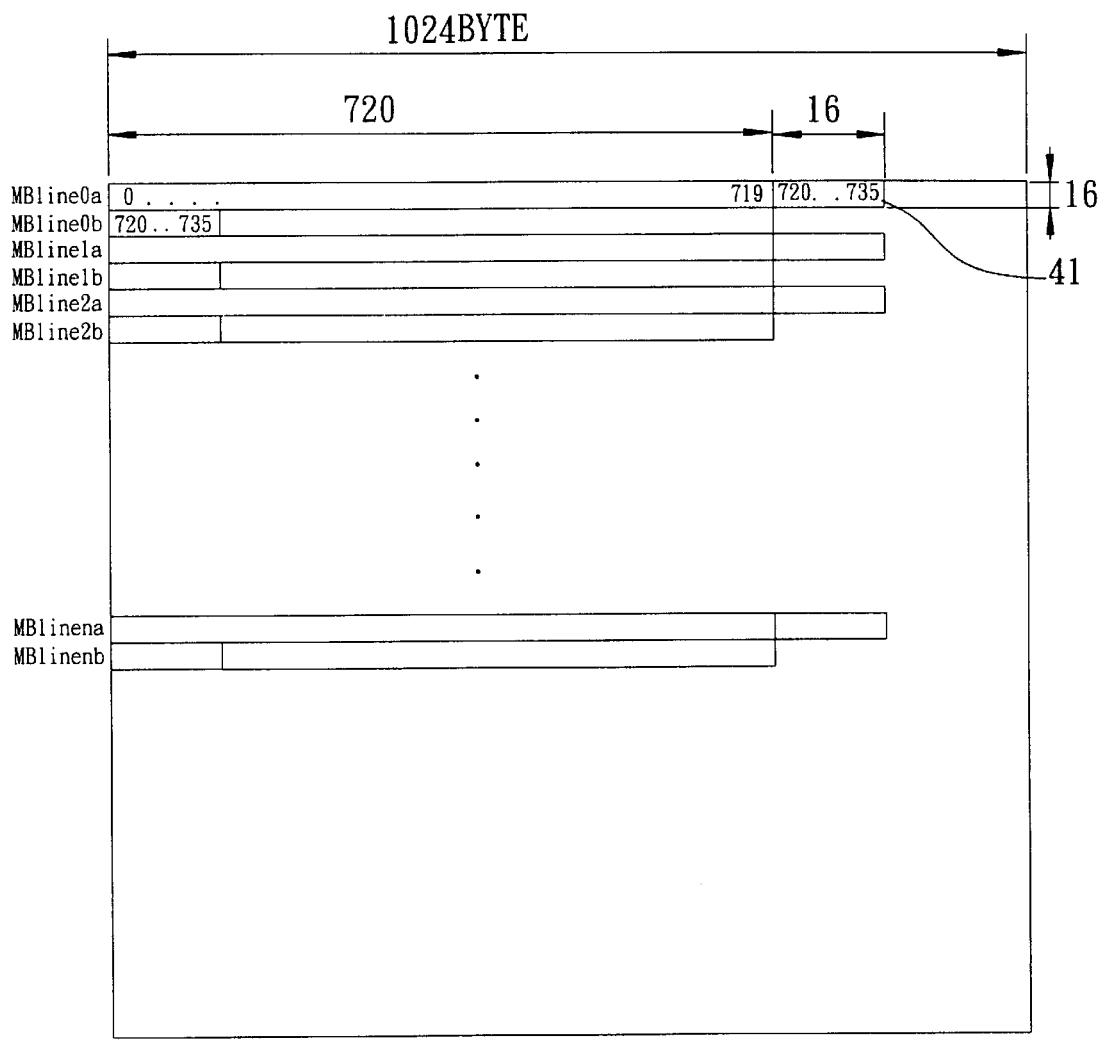
FIG. 4 shows a memory device for storing the reference frame in accordance with a second preferred embodiment of the present invention.

FIG. 4 shows the memory device 11 for storing a reference frame in according with another preferred embodiment of the present invention, wherein the memory device 11 is a DRAM device and each row of the DRAM has 1024 bytes. This preferred embodiment is the same as the previous one except that the pixels of the frame are arranged as a plurality of macroblock (MB) lines for being stored in the DRAM, wherein a macroblock line is defined to be a pixel region with a length equal to the width of a frame and a height of 16 pixels. Therefore, similar to the first preferred embodiment, one macroblock line of the frame can be stored in at leat two macroblock rows of the DRAM. In this preferred embodiment, one macroblock line is broken into two lines for being stored in two macroblock rows of the DRAM. As shown in FIG. 4, the n-th macroblock line of the frame is broken into two lines, denoted by MB line na and MB line nb, to be stored in two macroblock rows of the DRAM, and at the end of the first macroblock row where the macroblock line is broken, a tail section 41 is allocated for duplicating and storing pixels that are the same as those with a length of a macroblock at the starting position of the next macroblock row. As such, the page break problem can also be removed without negatively influencing the decompressing performance.

Figure 5:
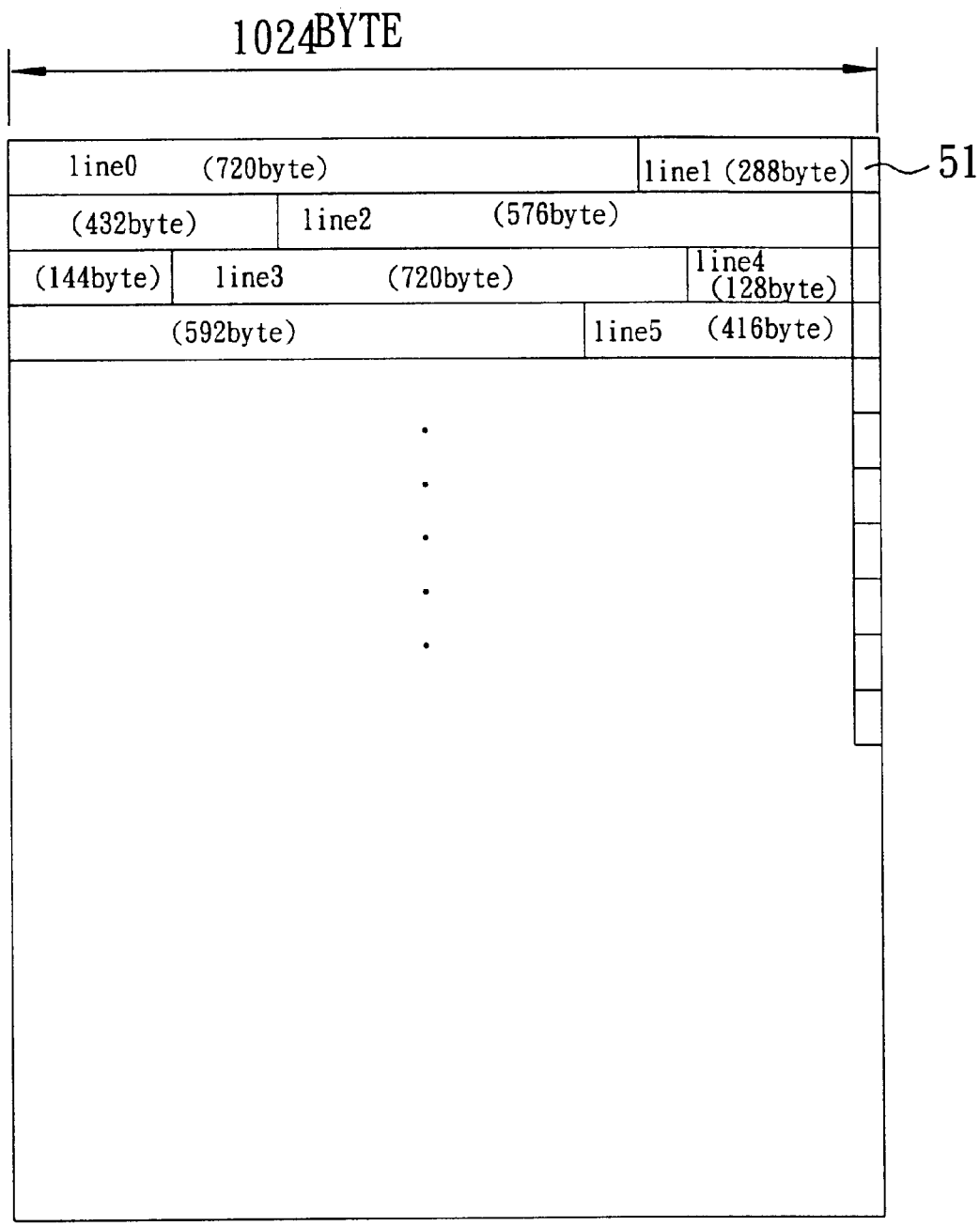
FIG. 5 shows a memory device for storing the reference frame in accordance with a third preferred embodiment of the present invention.
Figure 6:
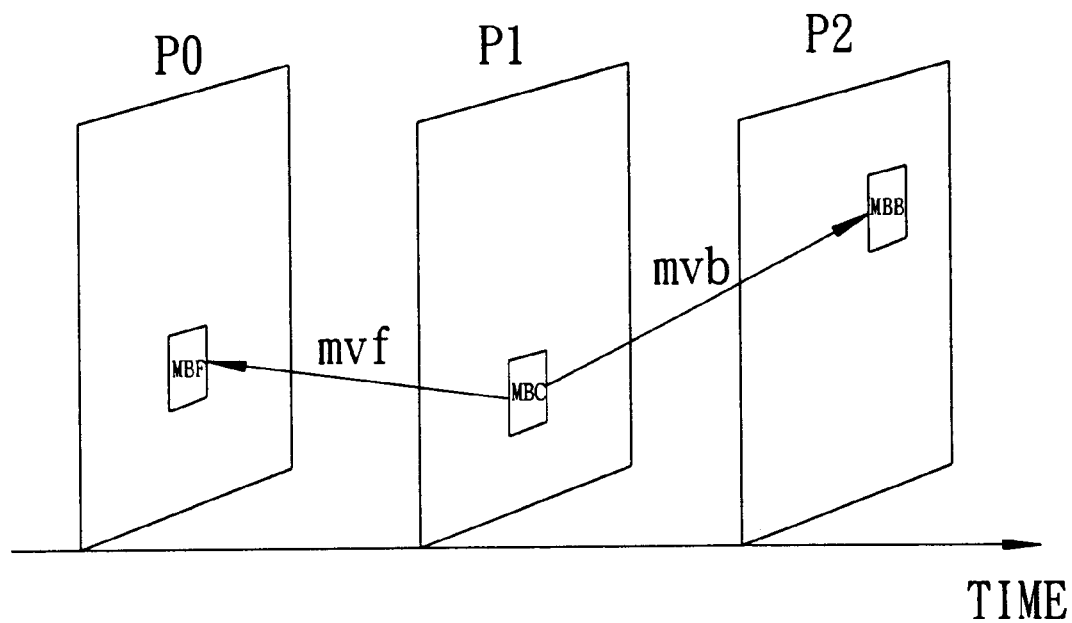
FIG. 6 schematically illustrates a motion compensation process in the time domain for a MPEG system.
Figure 7:
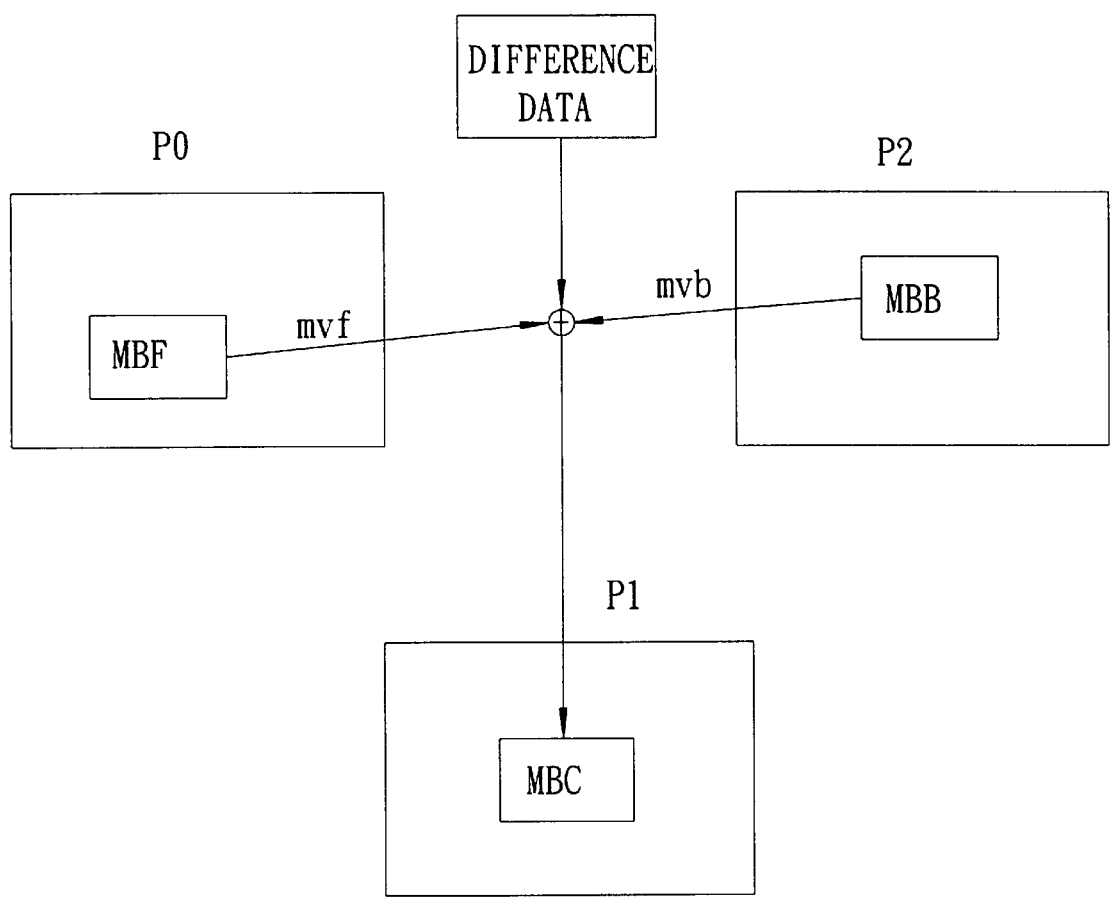
FIG. 7 schematically illustrates the reconstruction of a B-type macroblock in a conventional MPEG system.
Figure 8:
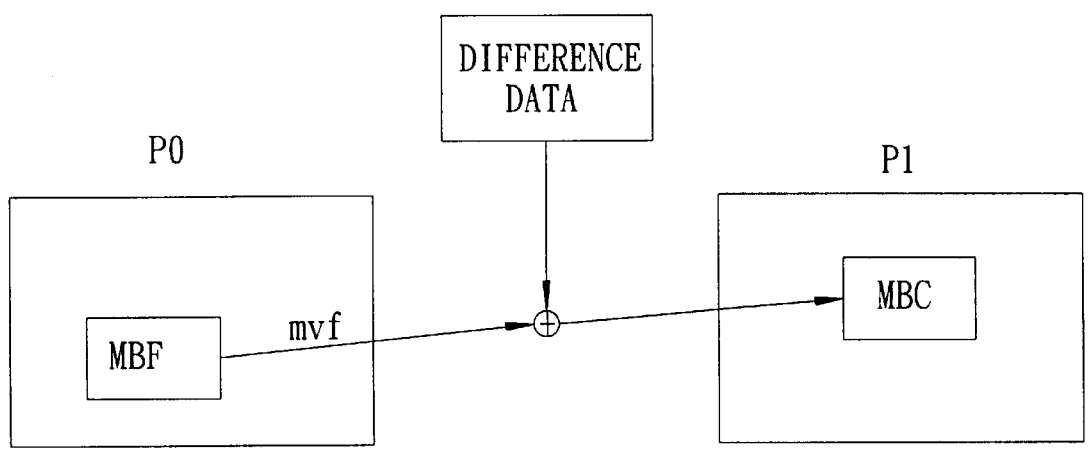
FIG. 8 schematically illustrates the reconstruction of a P-type macroblock in a conventional MPEG system.
Figure 9:
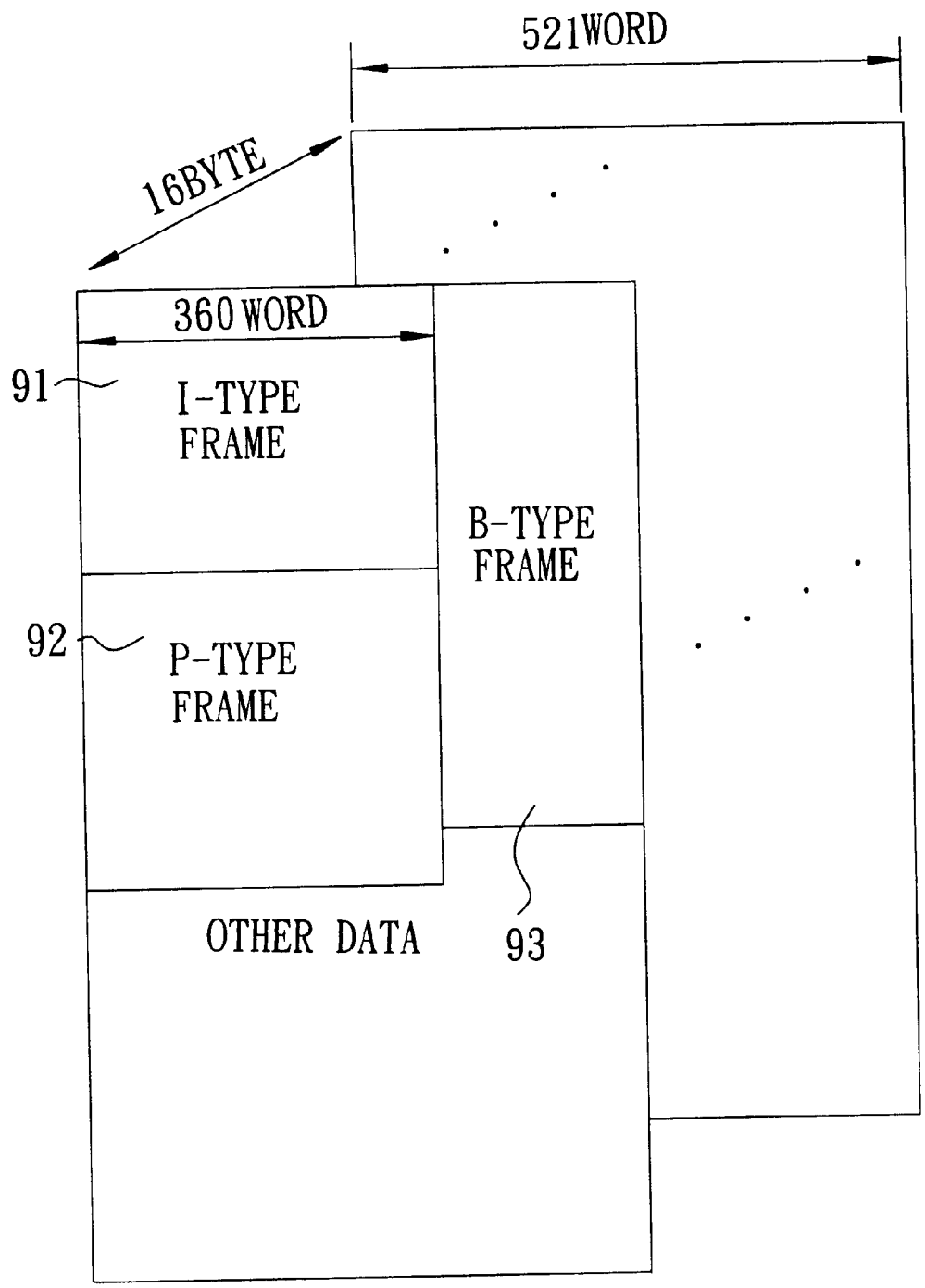
FIG. 9 schematically illustartes the memory layout arrangement in a conventional MPEG system.

FIG. 5 shows the memory device 11 for storing a reference frame in according with a third preferred embodiment of the present invention, wherein the memory device 11 is a DRAM device and each row of the DRAM has 1024 bytes.

As shown, the 720 pixels of a horizontal line of the reference frame are stored in the DRAM in a linear address mode. That is, every horizontal line, denoted by line 0, 1, 2 , . . . , of the reference frame, is continously stored in the row of the DRAM according to the order of the DRAM address. Similar to the previous embodiment, at the end of each DRAM row, a tail section 51 is allocated for duplicating and storing pixels that are the same as those of a macroblock at the starting position of the next row. As such, the page break problem can also be removed for the memory device using the linear addressing mode without negatively influencing the decompressing performance.

Although the present invention has been explained in relation to its preferred embodiment, it is to be understood that many other possible modifications and variations can be made without departing from the spirit and scope of the invention as hereinafter claimed.

What is claimed is:

1. A video decompressing system with efficienct memory access capability, comprising:

a decompressing means;

a memory device for storing reference frames which are read out for decompressing; and a memory controller for controlling memory access to the memory device, so as to read data from the memory device for being processed by the decompressing means, thereby reconstructing original frames to be stored in the memory device;

wherein, the reference frame has its pixels arranged as a plurality of horizontal lines for being stored in the memory device, and if the pixels of one horizontal line can not be integrally stored in one row of the memory device, the horizontal line is broken into at least two lines for being stored in the rows of the memory device, and at the end portion of the row where the horizontal line is broken, a tail section is allocated for duplicating and storing pixels that are the same as those of a macroblock at a starting position of the next row.

2. The system as claimed in claim 1, wherein the pixels of a horizontal line of the reference frame are stored in two rows of the memory device.

3. The system as claimed in claim 1, wherein the decompressing means includes a variable-length decoder, an inverse quantization and inverse discrete cosine transform process, and a frame reconstructor.

4. The system as claimed in claim 1, wherein the memory device is composed of dynamic random access memory.

5. A video decompressing system with efficienct memory access capability, comprising:

a decompressing means;

a memory device for storing reference frames which are read out for decompressing; and a memory controller for controlling memory access to the memory device, so as to read data from the memory device for being processed by the decompressing means, thereby reconstructing original frames to be stored in the memory device;

wherein, the reference frame has its pixels arranged as a plurality of macroblock lines for being stored in the memory device, and if the pixels of one macroblock line can not be integrally stored in one macroblock row of the memory device, the maroblock line is broken into at least two lines for being stored in the macroblock rows of the memory device, and at the end portion of the macroblock row where the macroblock line is broken, a tail section is allocated for duplicating and storing pixels that are the same as those with a length of a macroblock at a starting position of the next macroblock row.

6. The system as claimed in claim 5, wherein the pixels of a macroblock line of the reference frame are stored in two macroblock rows of the memory device.

7. The system as claimed in claim 5, wherein the decompressing means includes a variable-length decoder, an inverse quantization and inverse discrete cosine transform process, and a frame reconstructor.

8. The system as claimed in claim 5, wherein the memory device is composed of dynamic random access memory.

9. A video decompressing system with efficienct memory access capability, comprising:

a decompressing means;

a memory device for storing reference frames which are read out for decompressing; and a memory controller for controlling memory access to the memory device, so as to read data from the memory device for being processed by the decompressing means, thereby reconstructing original frames to be stored in the memory device;

wherein, the reference frame has its pixels arranged as a plurality of horizontal lines for being stored in the memory device in a linear address mode, and at the end of each row of the memory device, a tail section is allocated for duplicating and storing pixels that are the same as those of a macroblock at the starting position of the next row.

10. The system as claimed in claim 9, wherein the decompressing means includes a variable-length decoder, an inverse quantization and inverse discrete cosine transform process, and a frame reconstructor.

11. The system as claimed in claim 9, wherein the memory device is composed of dynamic random access memory.

* * * * *